(12) United States Patent
Zhou et al.

(10) Patent No.: US 11,049,923 B2
(45) Date of Patent: Jun. 29, 2021

(54) OLED DISPLAY PANEL AND OLED DISPLAY DEVICE

(71) Applicant: Wuhan China Star Optoelectronics Semiconductor Display Technology Co., Ltd., Wuhan (CN)

(72) Inventors: Yang Zhou, Wuhan (CN); Yong Zhao, Wuhan (CN); Mugyeom Kim, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,077

(22) PCT Filed: Feb. 20, 2019

(86) PCT No.: PCT/CN2019/075524
§ 371 (c)(1),
(2) Date: Jul. 4, 2019

(87) PCT Pub. No.: WO2020/133649
PCT Pub. Date: Jul. 2, 2020

(65) Prior Publication Data
US 2020/0219958 A1 Jul. 9, 2020

(30) Foreign Application Priority Data
Dec. 25, 2018 (CN) .......................... 201811594218.9

(51) Int. Cl.
*H01L 27/32* (2006.01)
*H01L 51/52* (2006.01)

(52) U.S. Cl.
CPC ........ *H01L 27/3276* (2013.01); *H01L 27/326* (2013.01); *H01L 27/3234* (2013.01); *H01L 27/3262* (2013.01); *H01L 27/3269* (2013.01); *H01L 51/5209* (2013.01); *H01L 2251/5338* (2013.01)

(58) Field of Classification Search
CPC ..................... H01L 27/3276; H01L 27/3269
See application file for complete search history.

(56) References Cited

U.S. PATENT DOCUMENTS

2017/0294502 A1* 10/2017 Ka ..................... H01L 27/3262
2018/0173349 A1* 6/2018 Cho .................... H01L 51/0097

* cited by examiner

*Primary Examiner* — Farun Lu

(57) ABSTRACT

Provided are an OLED display panel and an OLED display device. The OLED display panel includes a plurality of pixel regions arranged in an array and non light emitting regions between the plurality of pixel regions. The OLED display panel further includes a plurality of wires, and at least a portion of the wires are curved and arranged to form a plurality of light transmissive regions, and the light transmissive regions are disposed corresponding to the non light emitting regions. Thus, the light transmittance of the OLED display panel is greatly improved, which is advantageous for improving amount of light obtained by the photosensitive members disposed on the side of the substrate of the OLED display panel away from the pixel region.

8 Claims, 17 Drawing Sheets

OLED DISPLAY PANEL AND OLED DISPLAY DEVICE

RELATED APPLICATIONS

This application is a National Phase of PCT Patent Application No. PCT/CN2019/075524 having International filing date of Feb. 20, 2019, which claims the benefit of priority of Chinese Patent Application No. 201811594218.9 filed on Dec. 25, 2018. The contents of the above applications are all incorporated by reference as if fully set forth herein in their entirety.

FIELD AND BACKGROUND OF THE INVENTION

The present invention relates to a display technology field, and more particularly to an OLED display panel and an OLED display device.

The Organic Light Emitting Display (OLED) device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The OLED element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, the Indium Tin Oxide (ITO) electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

Please refer to FIG. 1, a conventional flexible OLED display panel is generally provided with a TFT array layer on a flexible substrate 100, and then an OLED device layer is disposed on the TFT array layer. The TFT array layer includes an active layer 210, a first metal layer 220, a second metal layer 230, a third metal layer 240 and an anode layer 250, which are sequentially disposed. A transparent insulating layer is disposed between the first metal layer 220 and the second metal layer 230 and between the second metal layer 230 and the third metal layer 240 for separation. The flexible substrate 100 is provided with a plurality of pixel regions arranged in an array and non light emitting regions located outside the pixel regions. The first metal layer 220 is used to form a gate of the TFT device, and a plurality of first metal layer wires 221 spaced apart are provided. The second metal layer 230 is used to form a capacitor plate, and a plurality of second metal layer wires 231 spaced apart are provided. The third metal layer 240 is used to form the source and drain of the TFT device, and a plurality of third metal layer wires 241 spaced apart are provided. The anode layer 250 includes a plurality of anodes 251 respectively located above the plurality of pixel regions. The first metal layer wire 221, the second metal layer wire 232 and the third metal layer wire 242 are linear and randomly arranged. The active layer 210, the first metal layer 220, the second metal layer 230, the third metal layer 240 and the anode layer 250 are all made of opaque materials and light transmittance cannot be achieved, resulting in poor light transmittance of the OLED display panel. In case a camera having a photosensitive member disposed on the side the OLED display panel with such structure having the flexible substrate is used to acquire light from the side of the OLED display panel away from the flexible substrate for imaging, the photosensitive member of the camera may acquire a smaller amount of light. The image quality is poor.

SUMMARY OF THE INVENTION

An objective of the present invention is to provide an organic light emitting diode (OLED) display panel having a higher light transmittance.

Another objective of the present invention is to provide an OLED display device possessing an OLED display panel having a higher light transmittance, which is advantageous for increasing amount of light obtained by a photosensitive member.

For achieving the aforesaid objectives, the present invention first provides an organic light emitting diode (OLED) display panel. The OLED display panel includes a plurality of pixel regions arranged in an array and non light emitting regions between the plurality of pixel regions;

wherein the organic light emitting diode display panel further includes a plurality of wires, and at least a portion of the wires are curved and arranged to form a plurality of light transmissive regions, and the light transmissive regions are disposed corresponding to the non light emitting regions.

The organic light emitting diode display panel includes a plurality of metal layers, which are sequentially disposed, wherein each of the metal layers includes a plurality of wires, and a portion of the wires of at least one of the metal layers are curved to form the plurality of light transmitting regions.

A portion of the wires of at least two of the metal layers are curved to define the plurality of light transmissive regions.

In any two of the metal layers having the wires surrounding the light transmissive region, a width of the wires surrounding the light transmissive region in the metal layer away from the pixel region is equal to a width of the wires surrounding the light transmissive region in the metal layer close to the pixel region; or the width of the wires surrounding the light transmissive region in the metal layer away from the pixel region is greater than the width of the wires surrounding the light transmissive region in the metal layer close to the pixel region.

In any two of the metal layers having the wires surrounding the light transmissive region, a width of the wires surrounding the light transmissive region in the metal layer away from the pixel region is greater than a width of the wires surrounding the light transmissive region in the metal layer close to the pixel region, and the wires surrounding the light transmissive region in at least one of the metal layers include a plurality of sub-wires spaced apart.

In any two of the metal layers having the wires surrounding the light transmissive region, a distance between the wires surrounding the light transmissive region in the metal layer away from the pixel region and a center of the light transmissive region is less than a distance between the wires surrounding the light transmissive region in the metal layer close to the pixel region and the center of the light transmissive region.

The organic light emitting diode display panel includes a substrate, an active layer disposed on the substrate, a first metal layer disposed on the substrate and the active layer, a first insulating layer disposed on the substrate, the active layer and the first metal layer, a second metal layer disposed on the first insulating layer, a second insulating layer disposed on the second metal layer and the first insulating layer, a third metal layer disposed on the second insulating layer, a planarization layer disposed on the third metal layer and the second insulating layer and an anode layer disposed on the planarization layer;

wherein the active layer is disposed corresponding to the plurality of pixel regions; the first metal layer includes a plurality of first wires; the second metal layer includes a plurality of second wires; the third metal layer includes a plurality of third wires; wherein the anode layer includes a plurality of anodes, which are spaced apart, and each of the anodes is disposed opposite to one pixel region;

wherein at least a portion of the first wires is curved, at least a portion of the second wires is curved and at least a portion of the third wires is curved to define the plurality of light transmissive regions.

A shape of the light transmissive region is a circle, a polygon, a pattern surrounded by a plurality of arcs, or a pattern surrounded by at least one line segment and at least one arc.

The plurality of light transmissive regions are arranged in an array; a light transmissive region is disposed among four adjacent vertices of any four adjacent pixel regions; or a light transmissive region is disposed between any two adjacent pixel regions in the pixel regions of a same row; or a light transmissive region is disposed between any two adjacent pixel regions in the pixel regions of a same column.

One side of the substrate away from the pixel region is provided with grooves for placing the photosensitive members.

The present invention further provides an organic light emitting diode display device, including the foregoing organic light emitting diode display panel and photosensitive members disposed on one side of the organic light emitting diode display panel.

The benefits of the present invention are: the OLED display panel includes a plurality of pixel regions arranged in an array and non light emitting regions between the plurality of pixel regions. The OLED display panel further includes a plurality of wires, and at least a portion of the wires are curved and arranged to form a plurality of light transmissive regions, and the light transmissive regions are disposed corresponding to the non light emitting regions. Thus, the light transmittance of the OLED display panel is greatly improved, which is advantageous for improving amount of light obtained by the photosensitive members disposed on the side of the substrate of the OLED display panel away from the pixel region. The OLED display device of the present invention has a higher light transmittance, which is advantageous for increasing amount of light obtained by a photosensitive member.

BRIEF DESCRIPTION OF THE SEVERAL VIEWS OF THE DRAWINGS

In order to better understand the characteristics and technical aspect of the invention, please refer to the following detailed description and accompanying drawings of the present invention. However, the drawings are provided for reference only and are not intended to be limiting of the invention.

In drawings.

DESCRIPTION OF SPECIFIC EMBODIMENTS OF THE INVENTION

For better explaining the technical solution and the effect of the present invention, the present invention will be further described in detail with the accompanying drawings and the specific embodiments.

Figure 1:
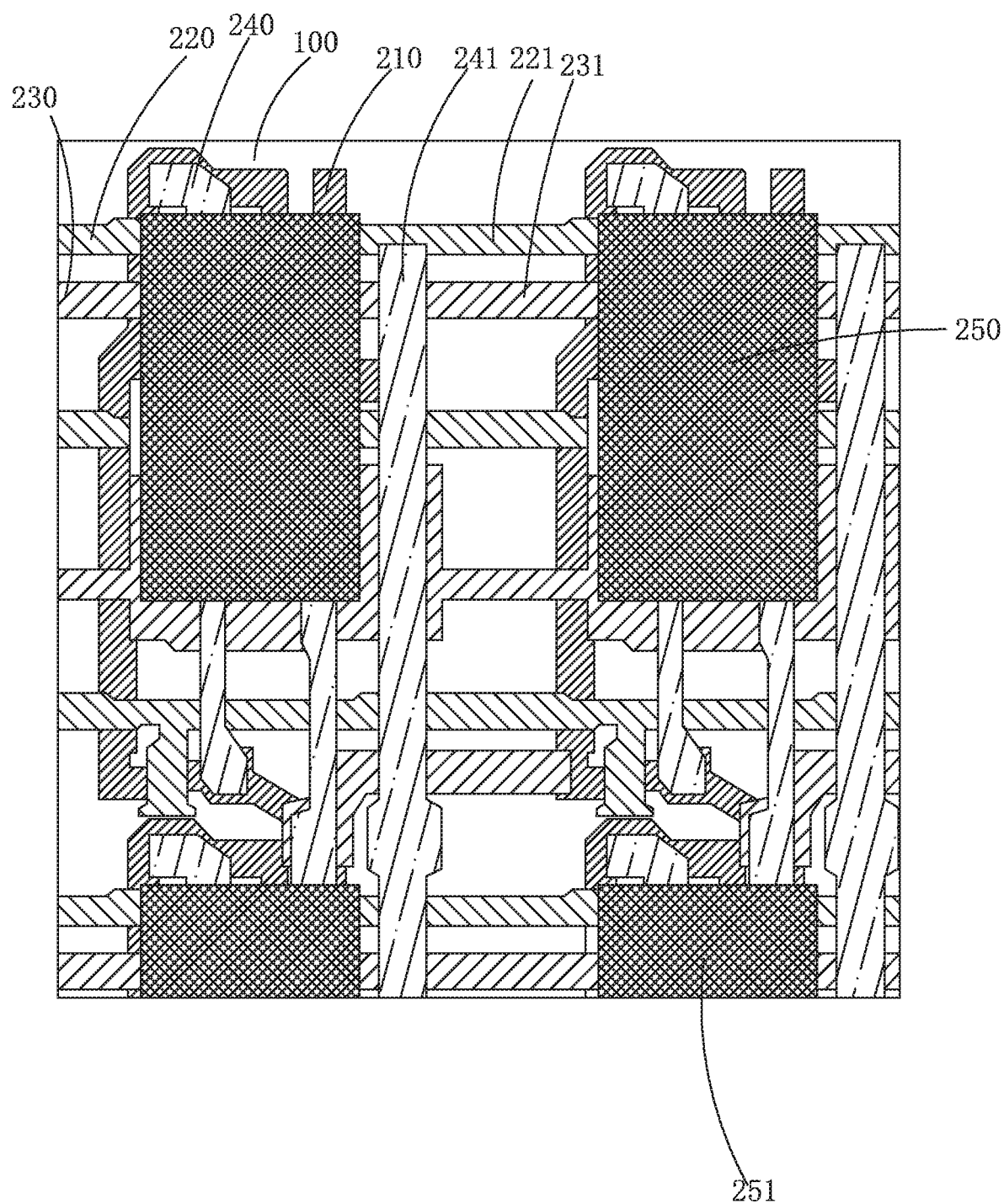
FIG. 1 is a top view diagram of an organic light emitting diode (OLED) display panel according to the prior art.
Figure 2:
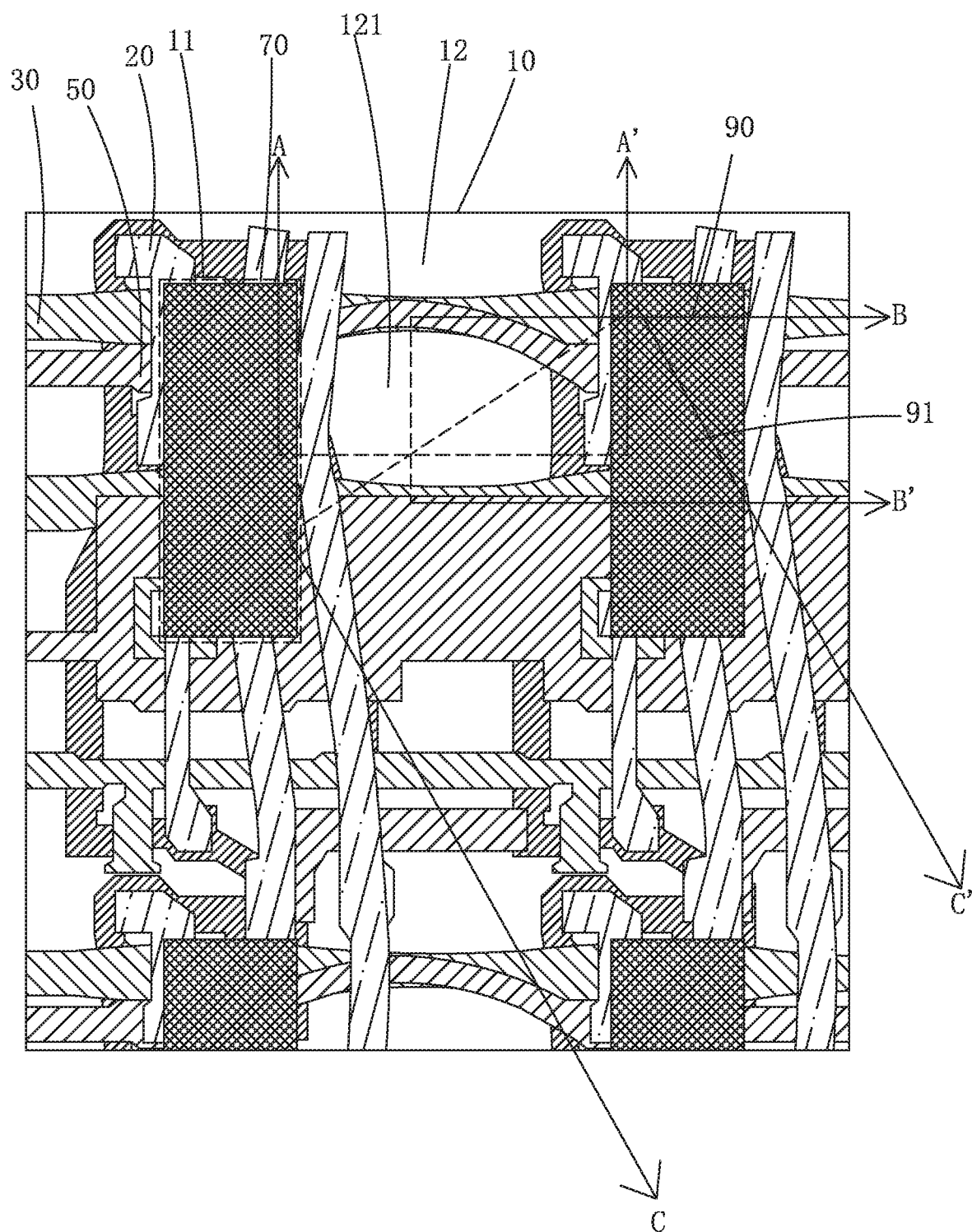
FIG. 2 is a top view diagram of an organic light emitting diode (OLED) display panel according to the first embodiment of the present invention.
Figure 3:
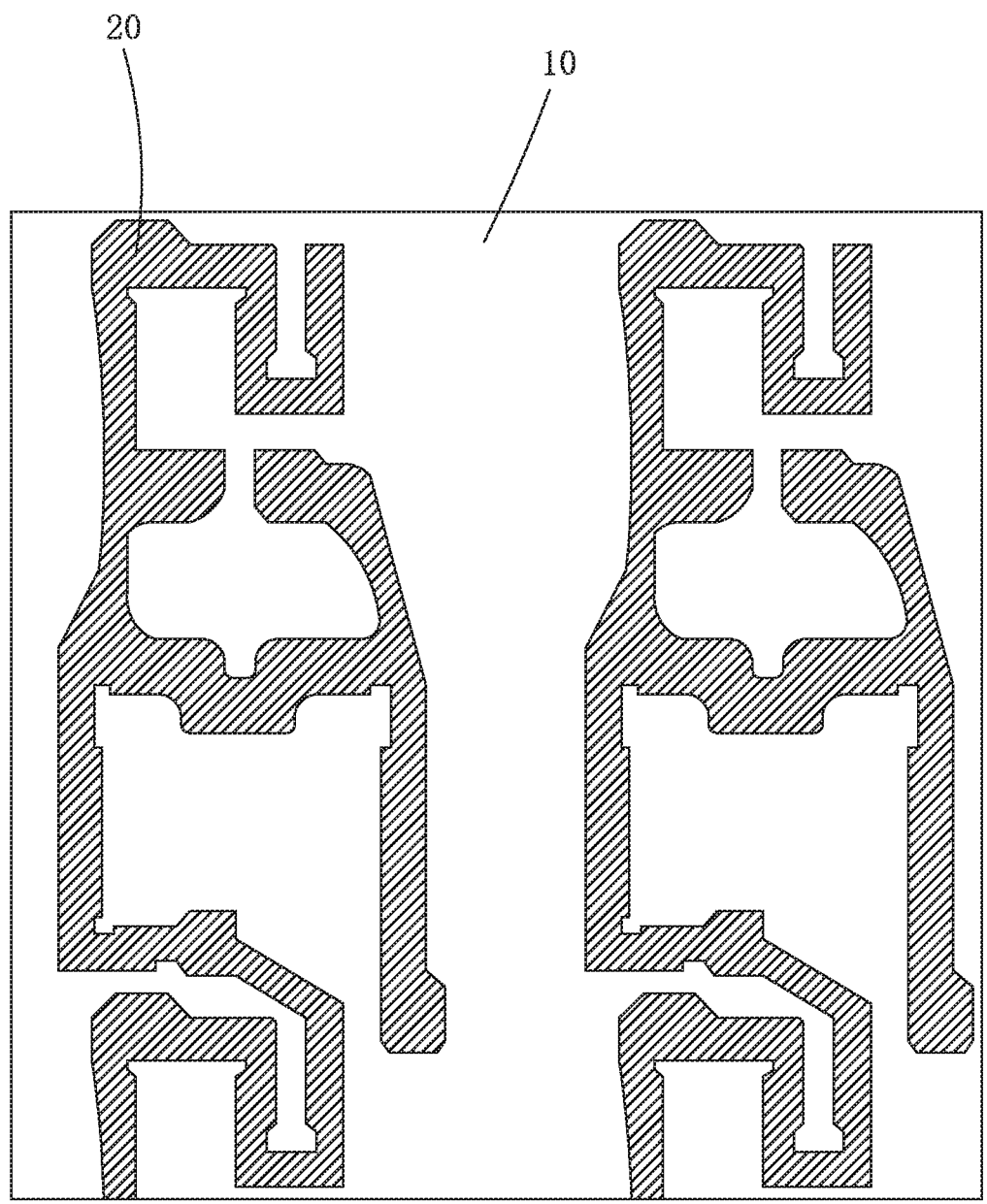
FIG. 3 is a top view diagram of an active layer and a structure underneath of an OLED display panel according to the first embodiment of the present invention.
Figure 4:
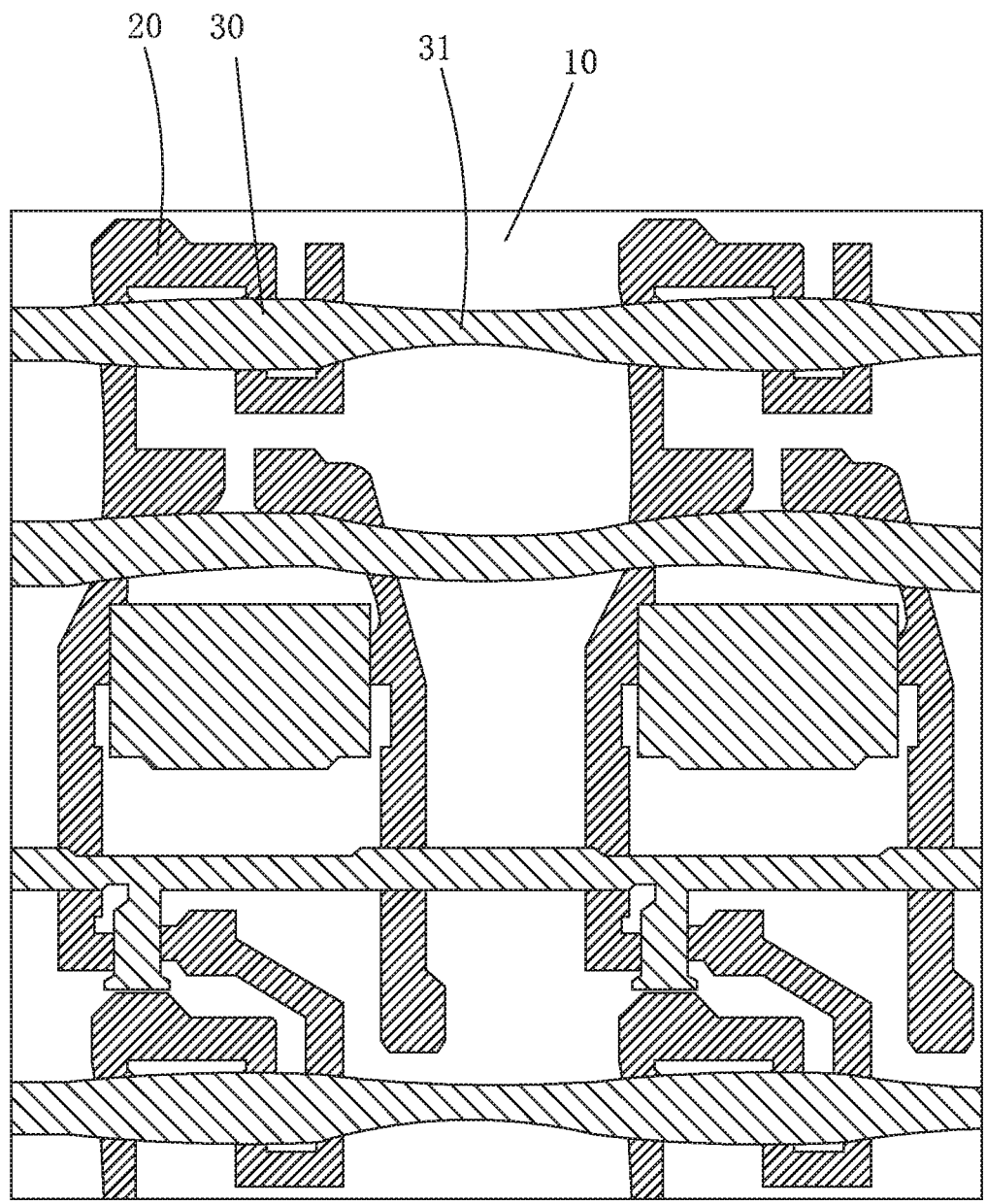
FIG. 4 is a top view diagram of a first metal layer and a structure underneath of an OLED display panel according to the first embodiment of the present invention.
Figure 5:
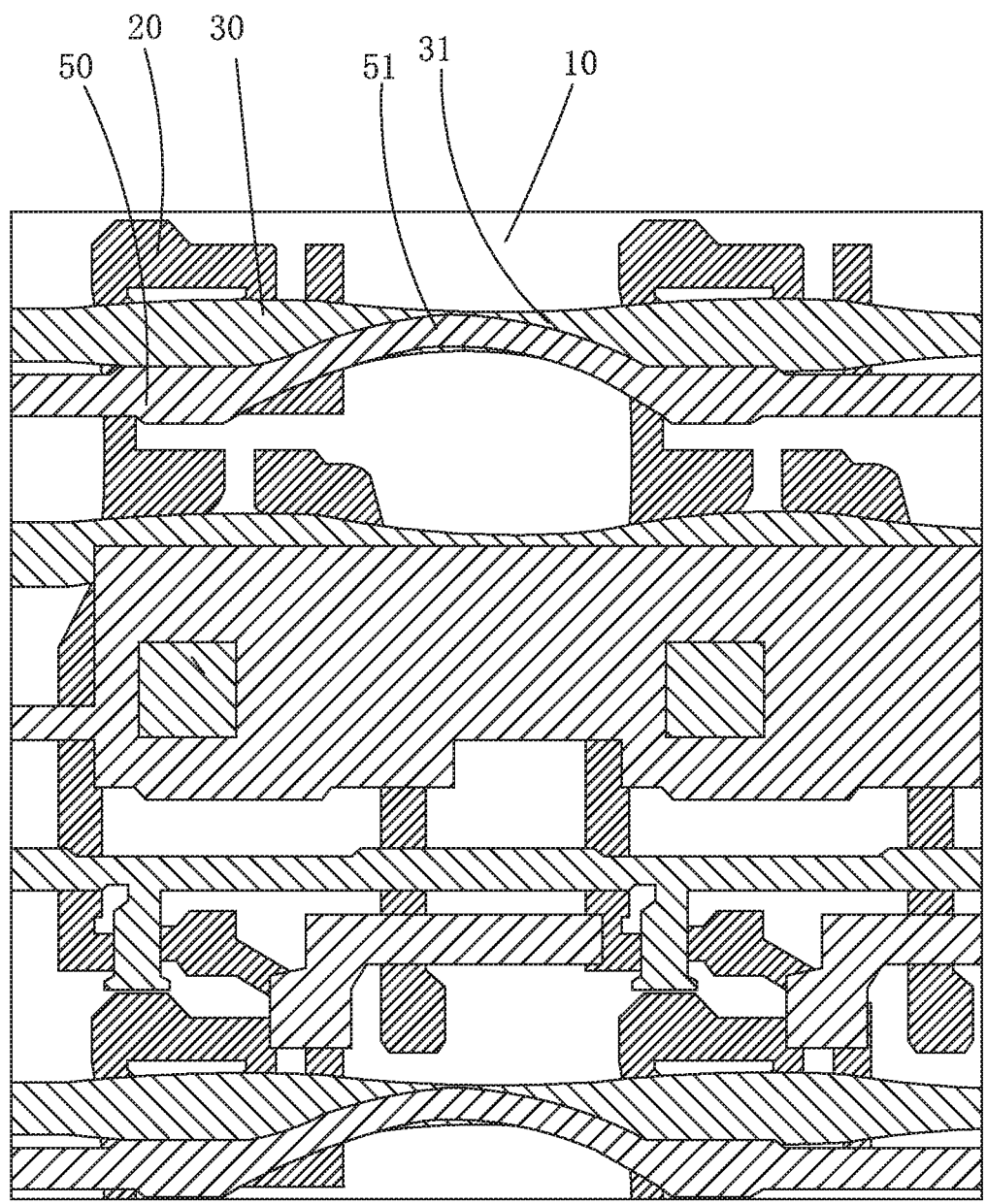
FIG. 5 is a top view diagram of a second metal layer and a structure underneath of an OLED display panel according to the first embodiment of the present invention.
Figure 6:
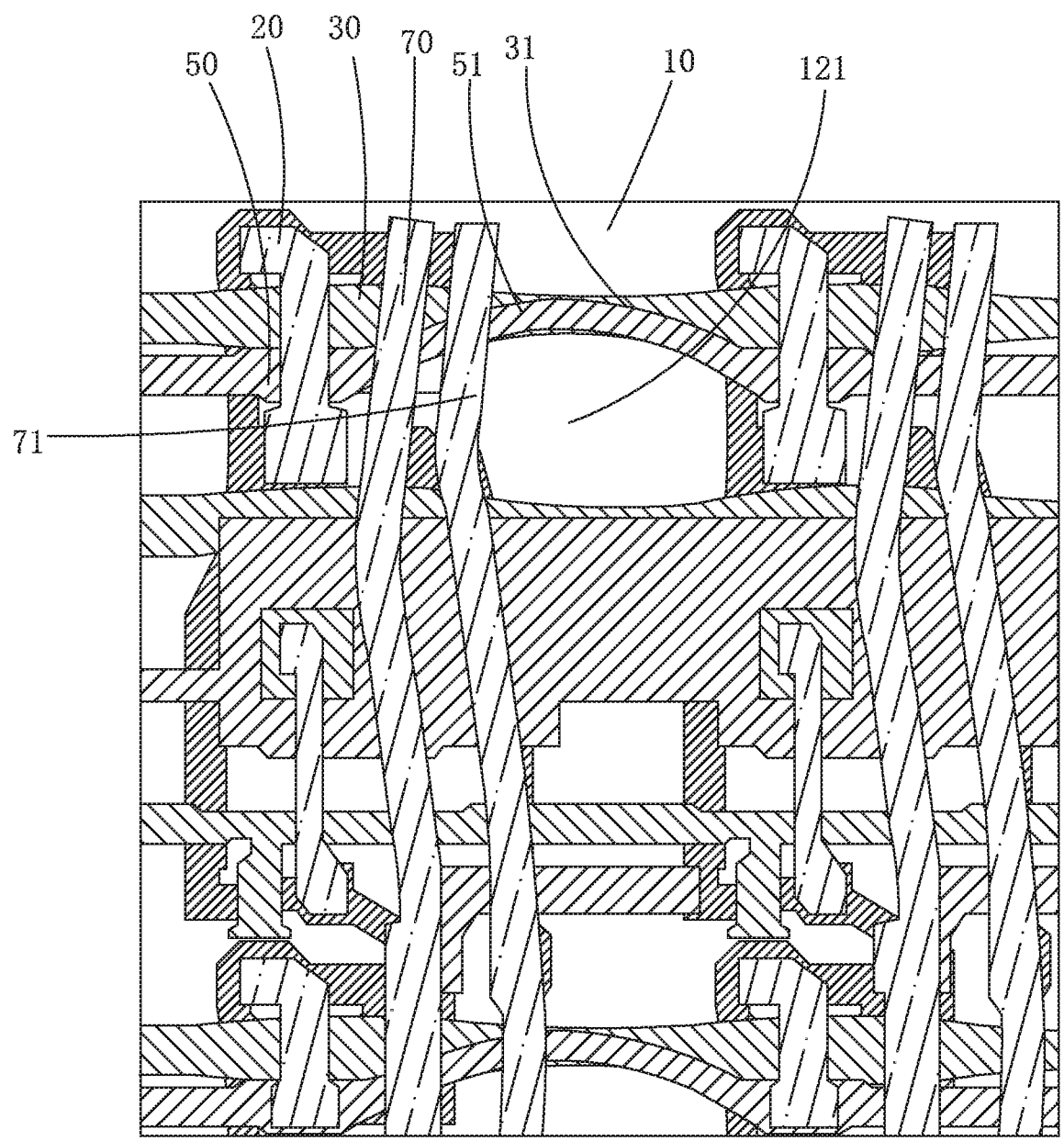
FIG. 6 is a top view diagram of a third metal layer and a structure underneath of an OLED display panel according to the first embodiment of the present invention.
Figure 7:
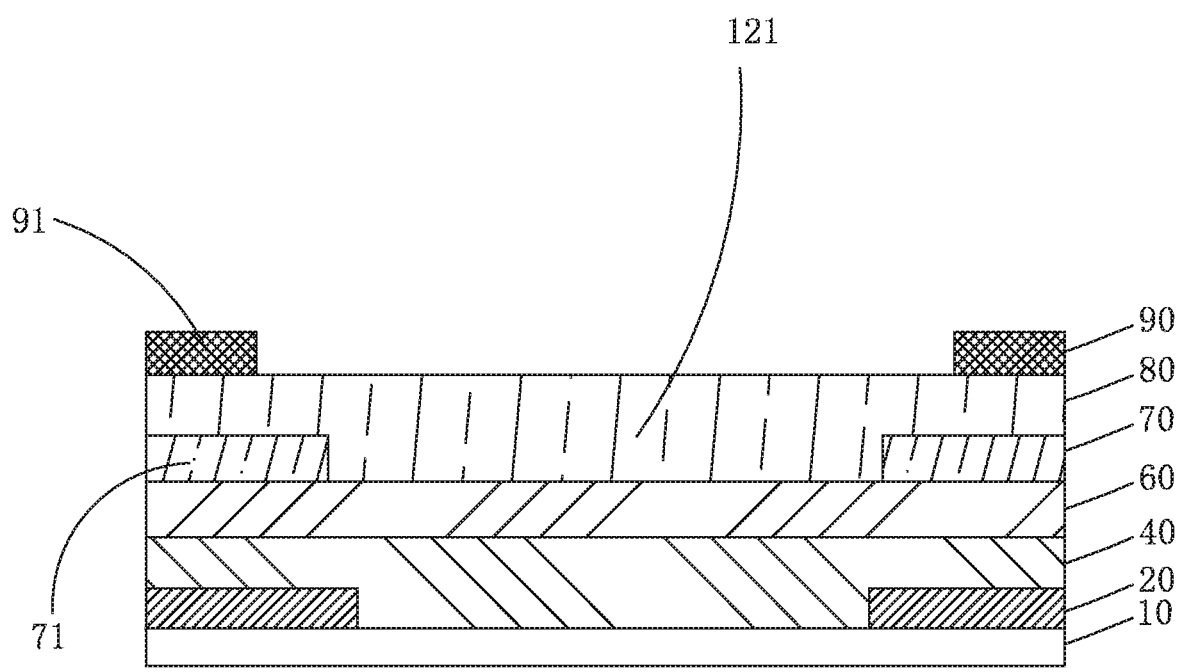
FIG. 7 is a cross-sectional diagram along line A-A' of FIG. 2.
Figure 8:
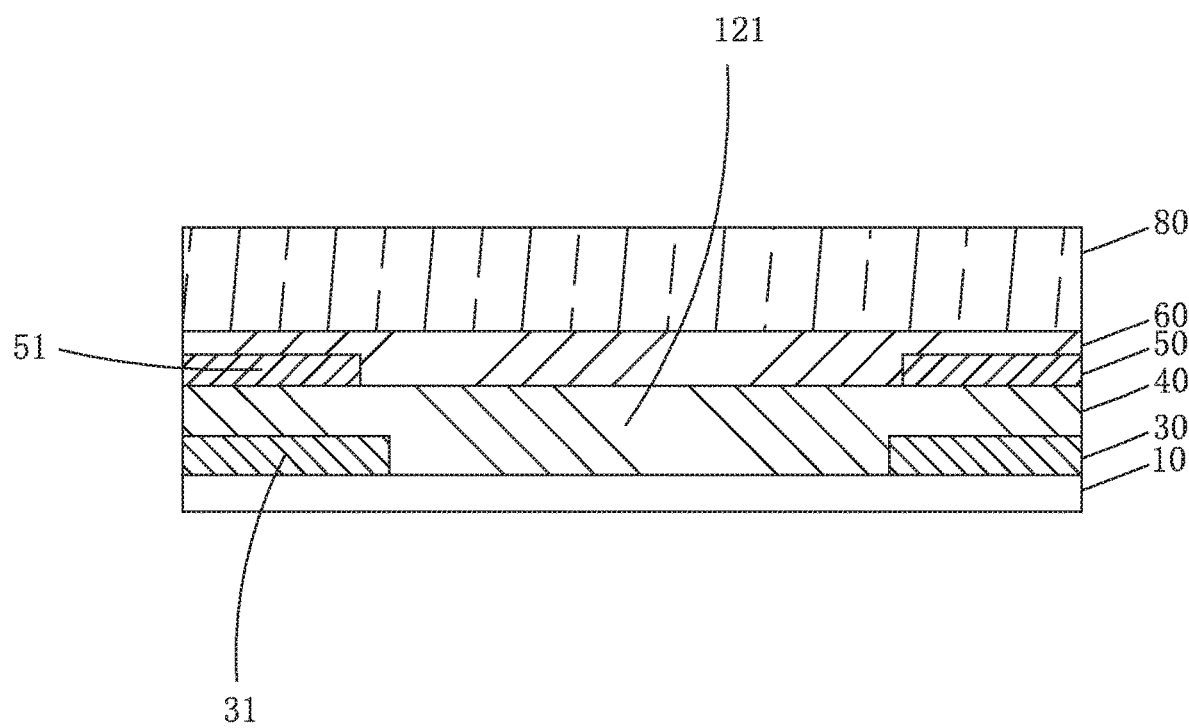
FIG. 8 is a cross-sectional diagram along line B-B' of FIG. 2.
Figure 9:
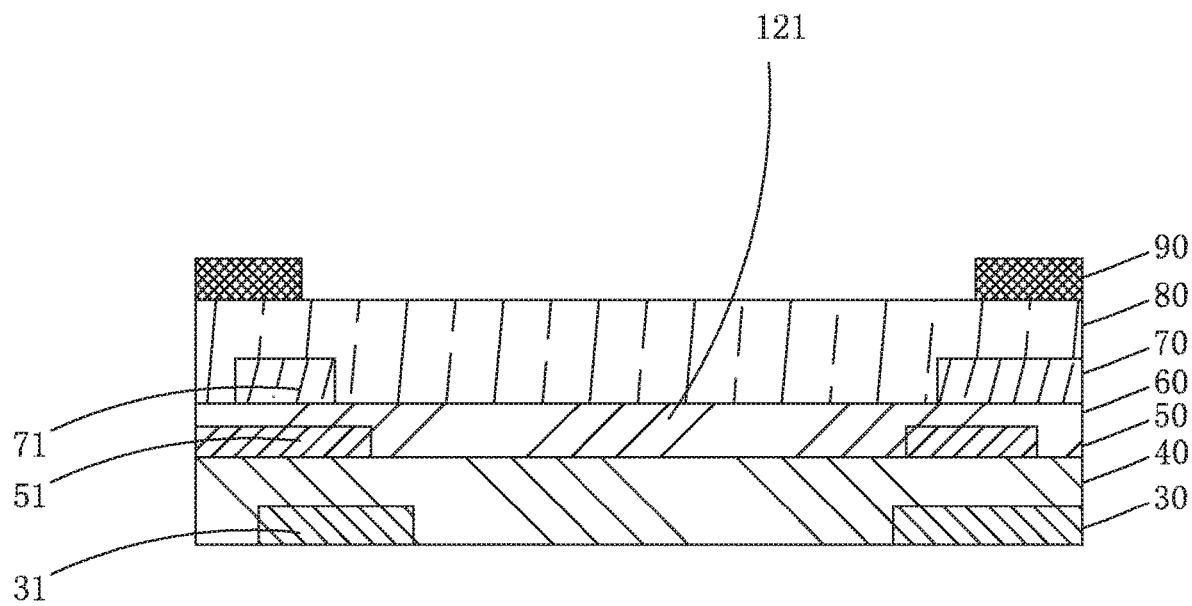
FIG. 9 is a cross-sectional diagram of the first metal layer and an upper film layer thereabove along line C-C' in FIG. 2.
Figure 10:
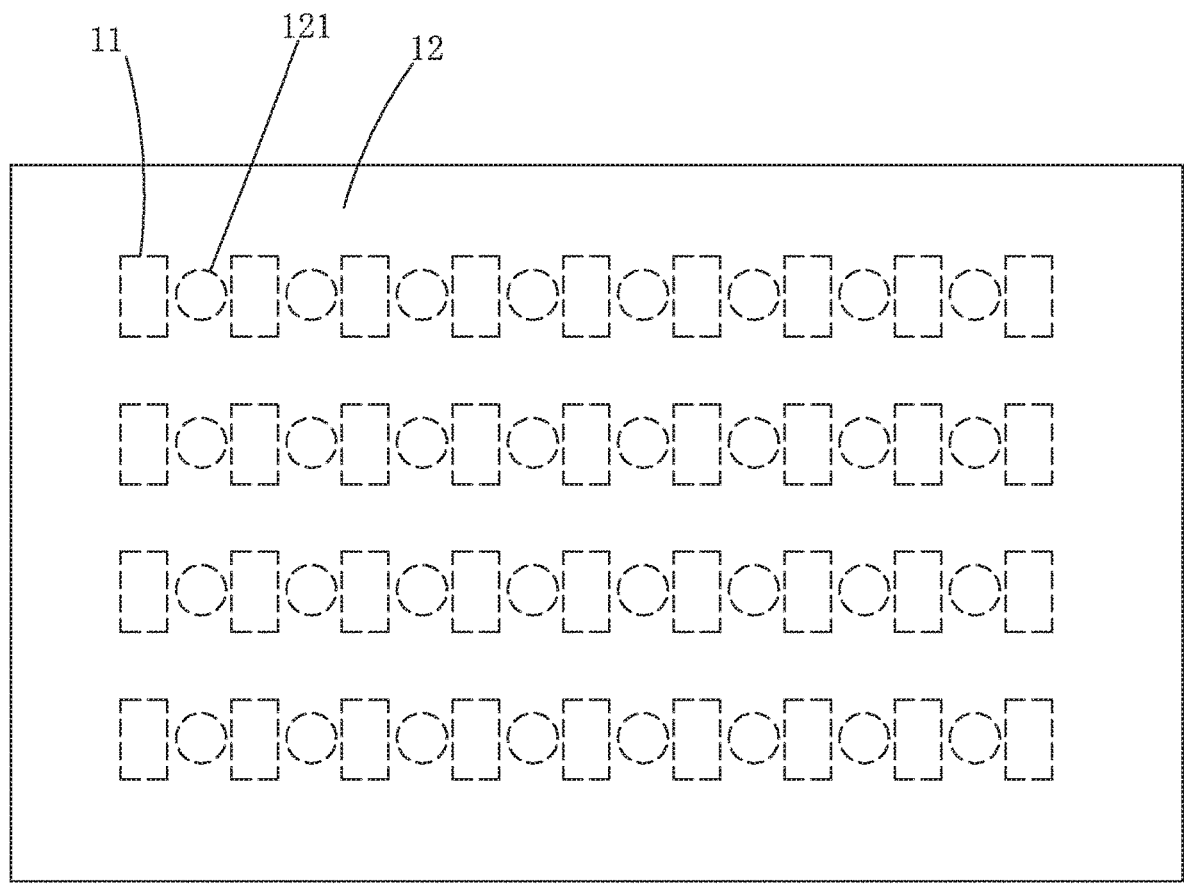
FIG. 10 is a diagram a positional relationship between pixel regions and light transmissive regions of a substrate of an OLED display panel according to the second embodiment of the present invention.
Figure 11:
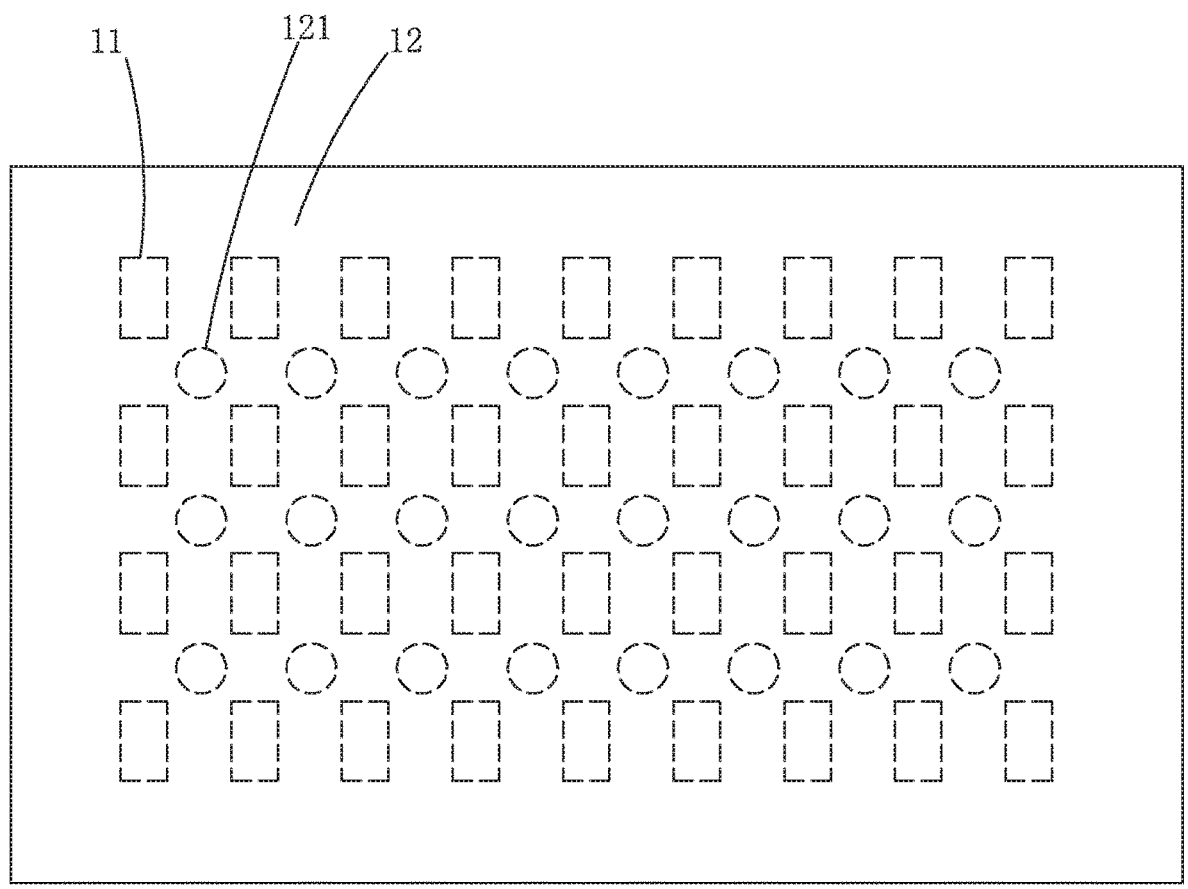
FIG. 11 is a diagram a positional relationship between pixel regions and light transmissive regions of a substrate of an OLED display panel according to the third embodiment of the present invention.
Figure 12:
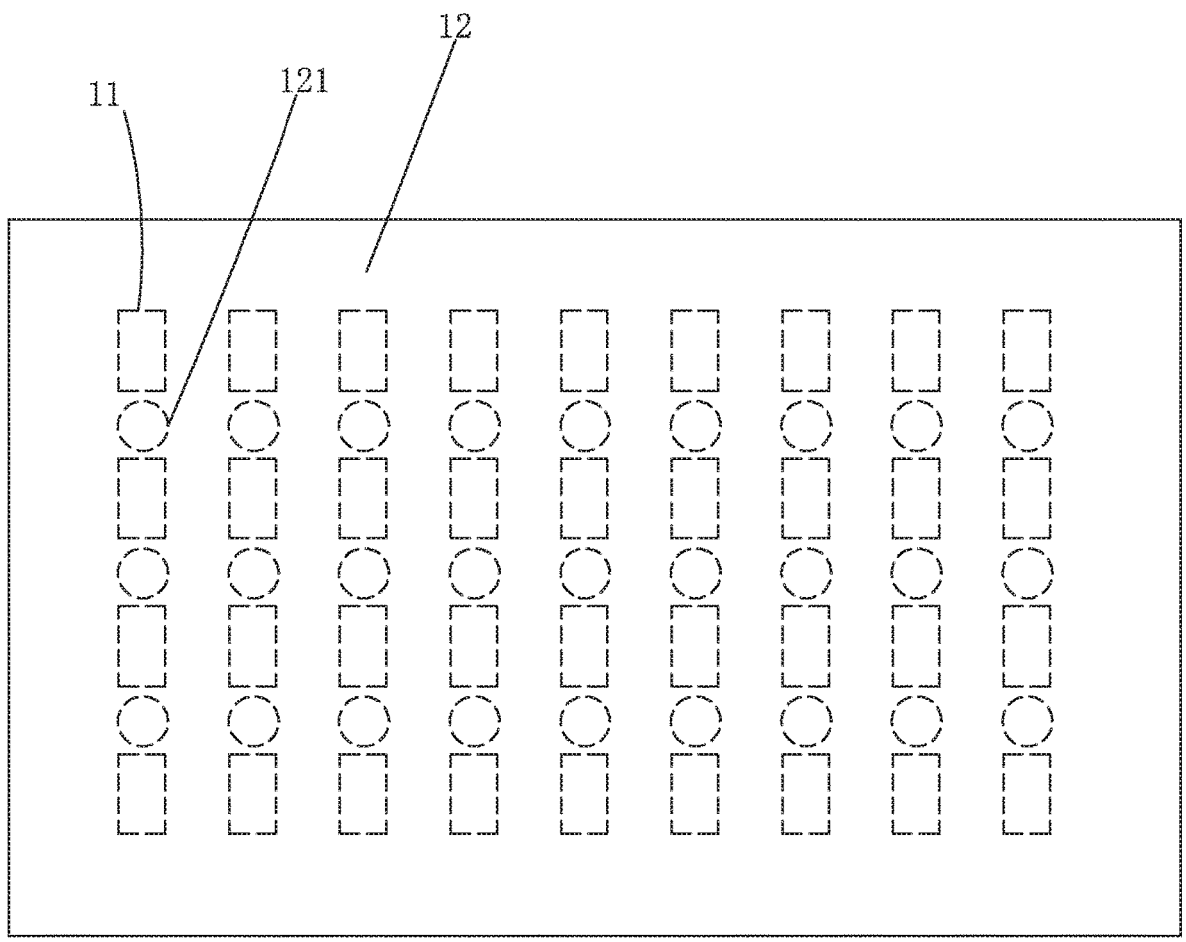
FIG. 12 is a diagram a positional relationship between pixel regions and light transmissive regions of a substrate of an OLED display panel according to the fourth embodiment of the present invention.
Figure 13:
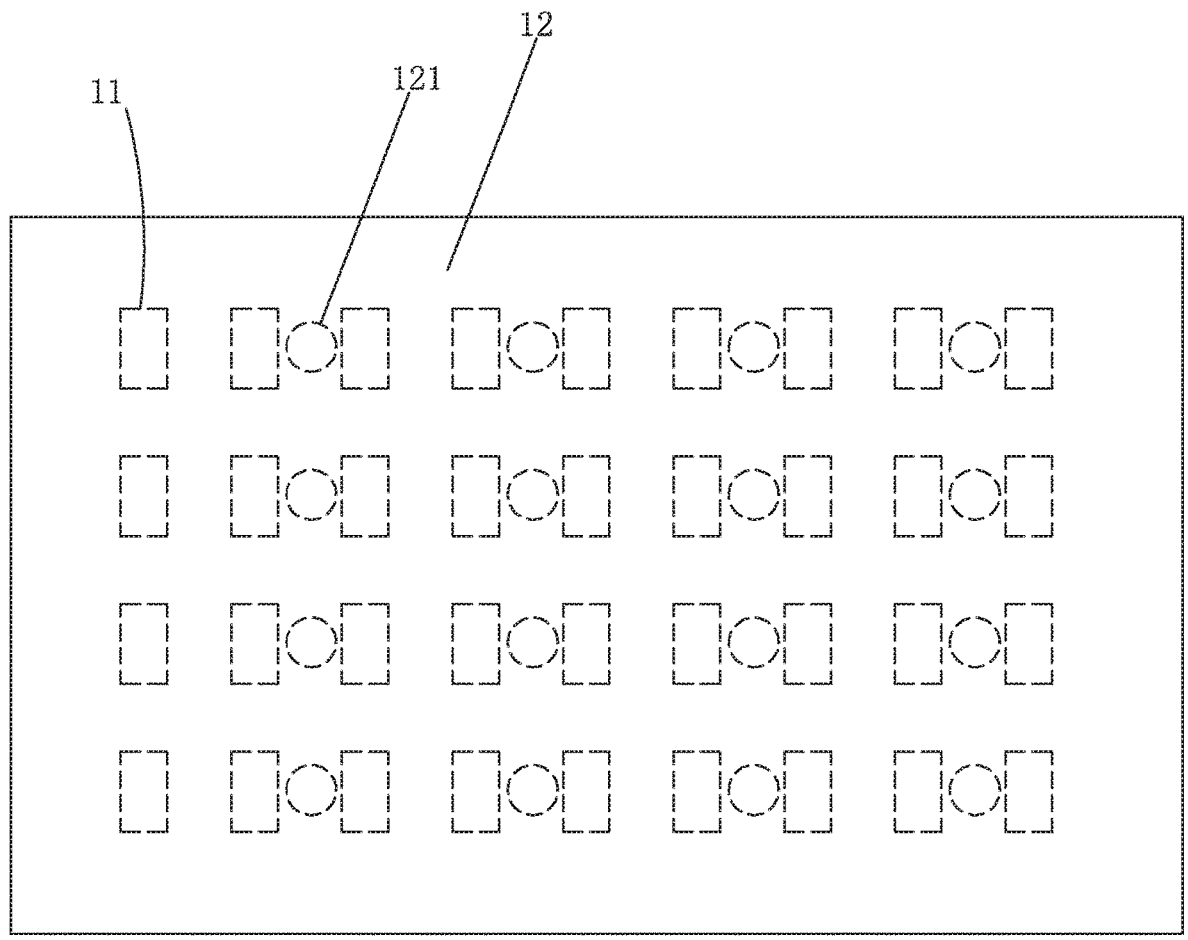
FIG. 13 is a diagram a positional relationship between pixel regions and light transmissive regions of a substrate of an OLED display panel according to the fifth embodiment of the present invention.
Figure 14:
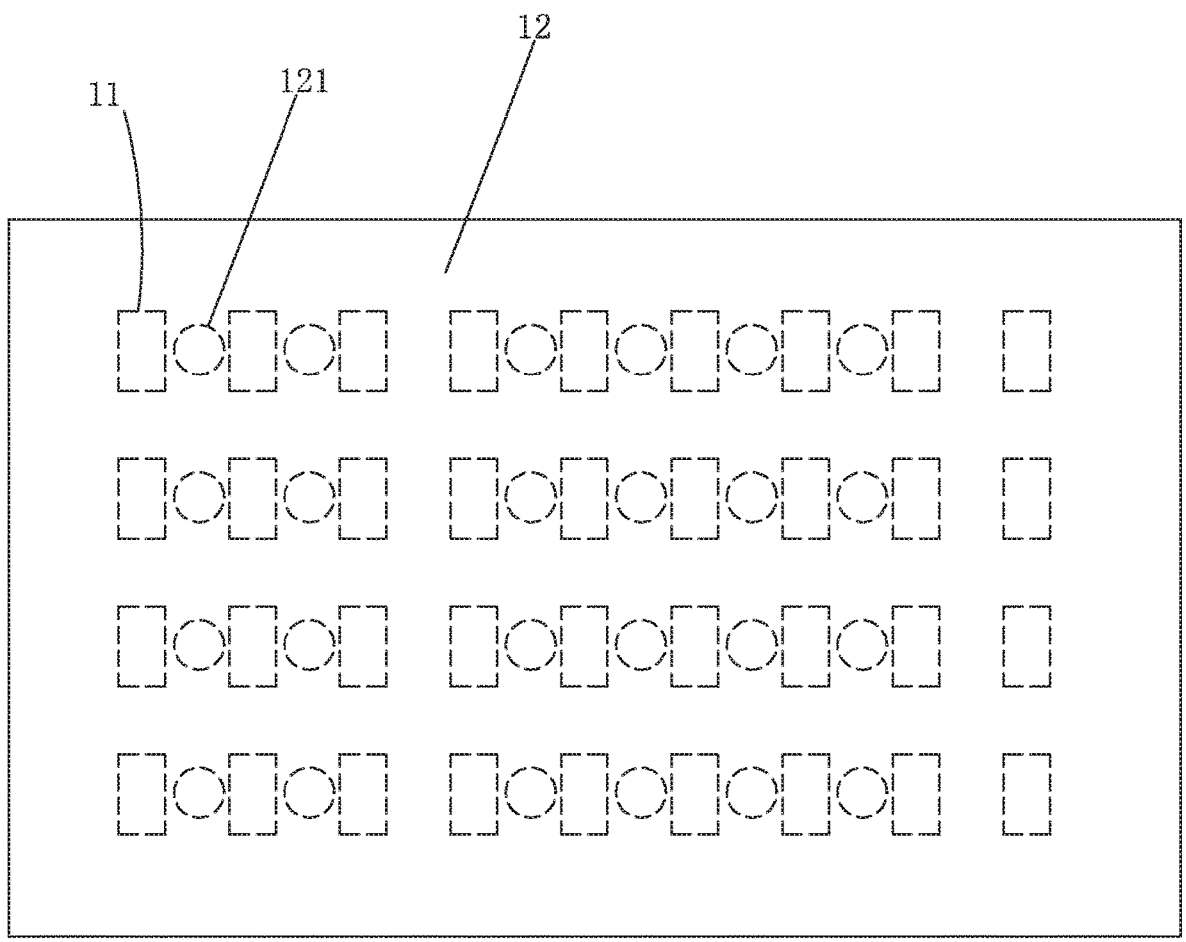
FIG. 14 is a diagram a positional relationship between pixel regions and light transmissive regions of a substrate of an OLED display panel according to the sixth embodiment of the present invention.

Please refer to FIG. 2. The present invention provides an organic light emitting diode (OLED) display panel. The OLED display panel includes a plurality of pixel regions 11 arranged in an array and non light emitting regions 12 between the plurality of pixel regions 11.

The organic light emitting diode display panel further includes a plurality of wires, and at least a portion of the wires are curved and arranged to form a plurality of light transmissive regions 121, and the light transmissive regions 121 are disposed corresponding to the non light emitting regions 12.

Specifically, the organic light emitting diode display panel includes a plurality of metal layers, which are sequentially disposed, wherein each of the metal layers includes a plurality of wires, and a portion of the wires of at least one of the metal layers are curved to form the plurality of light transmitting regions 121.

Preferably, a portion of the wires of at least two of the metal layers are curved to define the plurality of light transmissive regions 121.

Specifically, referring to FIG. 2 to FIG. 9, in the first embodiment of the present invention, the organic light emitting diode display panel includes a substrate 10, an active layer 20 disposed on the substrate 10, a first metal layer 30 disposed on the substrate 10 and the active layer 20, a first insulating layer 40 disposed on the substrate 10, the active layer 20 and the first metal layer 30, a second metal layer 50 disposed on the first insulating layer 40, a second insulating layer 60 disposed on the second metal layer 50 and the first insulating layer 40, a third metal layer 70 disposed on the second insulating layer 60, a planarization layer 80 disposed on the third metal layer 70 and the second insulating layer 60, an anode layer 90 disposed on the planarization layer 80 and a light emitting layer and a cathode layer (not shown) which are sequentially disposed on the anode layer 90.

The active layer 20 is disposed corresponding to the plurality of pixel regions 11. The first metal layer 30 includes a plurality of first wires 31. The second metal layer 50 includes a plurality of second wires 51. The third metal layer 70 includes a plurality of third wires 71. The anode layer 90 includes a plurality of anodes 91, which are spaced apart, and each of the anodes 91 is disposed opposite to one pixel region 11. Each of the pixel regions 11 includes an anode 91 and the light emitting layer and the cathode layer disposed on the anode 91.

At least a portion of the first wires 31 is curved, at least a portion of the second wires 51 is curved and at least a portion of the third wires 71 is curved to define the plurality of light transmissive regions 121. The portions of the substrate 10, the first insulating layer 40, the second insulating layer 60 and the planarization layer 80 located in each of the light transmissive regions 121 are transparent materials.

Specifically, one side of the substrate 10 away from the pixel region 11 is provided with grooves (not shown) for placing the photosensitive members.

Specifically, the substrate 10 is a flexible substrate, and may specifically be made of a combination of one or more of polyimide (PI), polyetherimide (PEI), polyphenylene sulfide (PPS) and polyarylate (PAR).

Specifically, a material of the active layer 20 may be amorphous silicon, low temperature polycrystalline silicon, oxide semiconductor, carbon nanotube or graphene.

Specifically, in the present invention, as a portion of the wires of at least two of the metal layers are curved to define the plurality of light transmissive regions 121, in any two of the metal layers having the wires surrounding the light transmissive region 121, a distance between the wires surrounding the light transmissive region 121 in the metal layer away from the pixel region 11 and a center of the light transmissive region 121 is less than a distance between the wires surrounding the light transmissive region 121 in the metal layer close to the pixel region 11 and the center of the light transmissive region 121. Specifically, referring to FIG. 7 to FIG. 9, in the first embodiment of the present invention, a distance between the first wires 31 surrounding the light transmissive region 121 in the first metal layer 30 and a center of the light transmissive region 121 is less than a distance between the second wires 51 surrounding the light transmissive region 121 in the second metal layer 50 and the center of the light transmissive region 121, and the distance between the second wires 51 surrounding the light transmissive region 121 in the second metal layer 50 and the center of the light transmissive region 121 is less than a distance between the third wires 71 surrounding the light transmissive region 121 in the third metal layer 70 and the center of the light transmissive region 121. Accordingly, a cross section of each of the light transmissive regions 121 possesses an inverted trapezoidal shape. When light is incident on the OLED display panel from the side of the third metal layer 70, the light is reflected on the sidewall of the wires surrounding the light transmissive regions 121, thereby the light transmissive regions 121 can concentrate the light and improve the transmittance of the OLED display panel.

Specifically, referring to FIG. 10 to FIG. 14, in the present invention, the specific arrangement density of the light transmissive regions 121 can be determined according to actual requirements. For instance, referring to FIG. 10, in the second embodiment of the present invention, a light transmissive region 121 may be disposed among four adjacent vertices of any four adjacent pixel regions 11. For another instance, referring to FIG. 11, in the third embodiment of the present invention, a light transmissive region 121 may be disposed between any two adjacent pixel regions 11 in the pixel regions 11 of the same row. For another instance, referring to FIG. 12, in the fourth embodiment of the present invention, a light transmissive region 121 may be disposed between any two adjacent pixel regions 11 in the pixel regions 11 of the same column. For another instance, referring to FIG. 13, in the fifth embodiment of the present invention, a light transmissive region 121 may be disposed on the right side of the pixel region 11 of the even columns. For another instance, referring to FIG. 14, in the sixth embodiment of the present invention, a light transmissive region 121 may be disposed on the right side of each of the pixel regions 11 except for the pixel region 11 of an integer multiple of three.

Figure 15:
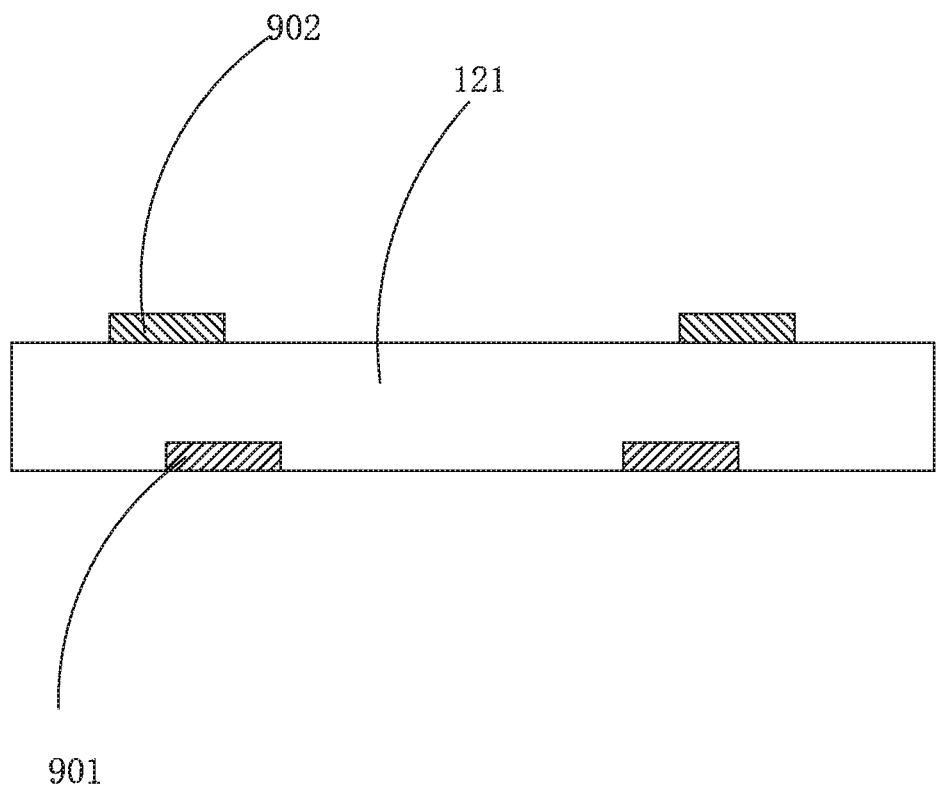
FIG. 15 is a cross-sectional diagram of two metal layers having wires surrounding a light transmissive region in the light transmissive region of the OLED display panel according to the seventh embodiment of the present invention.

Specifically, referring to FIG. 15, in the seventh embodiment of the present invention, a portion of the wires of at least two of the metal layers are curved to define the plurality of light transmissive regions 121, in any two of the metal layers having the wires surrounding the light transmissive region 121, a width of the wires 901 surrounding the light transmissive region 121 in the metal layer away from the pixel region 11 is equal to a width of the wires 902 surrounding the light transmissive region 121 in the metal layer close to the pixel region 11, and the wires are facilitated by making the wires surrounding the light transmissive region 121 equal in size.

Figure 16:
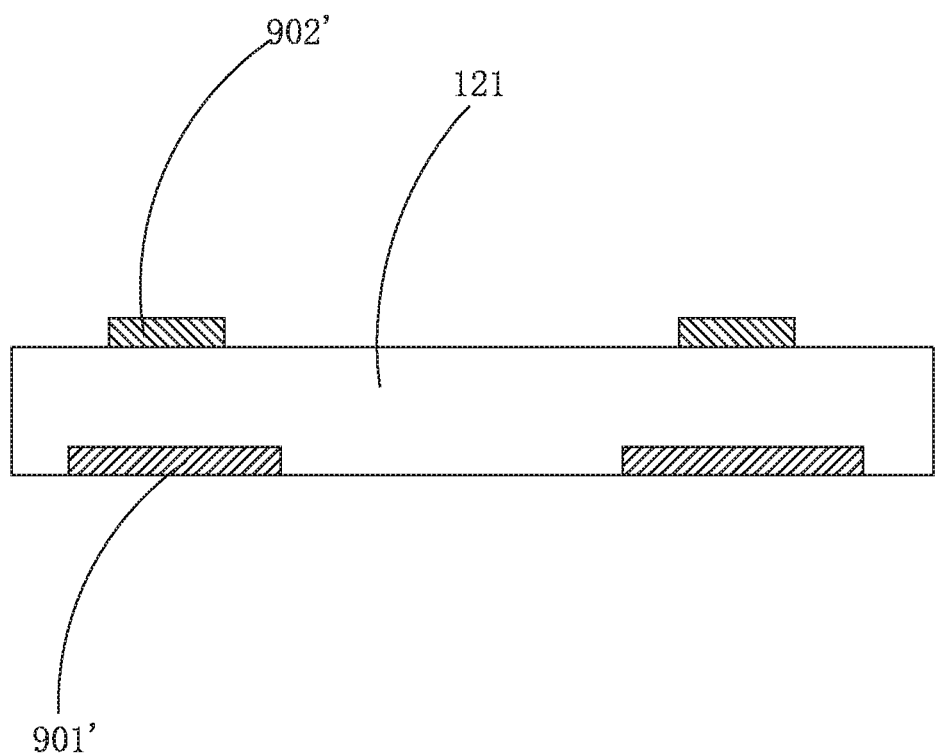
FIG. 16 is a cross-sectional diagram of two metal layers having wires surrounding a light transmissive region in the light transmissive region of the OLED display panel according to the eighth embodiment of the present invention.

Specifically, referring to FIG. 16, in the eighth embodiment of the present invention, a portion of the wires of at least two of the metal layers are curved to define the plurality of light transmissive regions 121, in any two of the metal layers having the wires surrounding the light transmissive region 121, a width of the wires 901' surrounding the light transmissive region 121 in the metal layer away from the pixel region 11 is greater than a width of the wires 902' surrounding the light transmissive region 121 in the metal layer close to the pixel region 11. Thus, both sides of the wire 902' may protrude from the wire 901' such that both sides of the wire 901' and both sides of the wire 902' may be used to surround the light transmissive region 121 for possessing a shape similar to an inverted trapezoid.

Figure 17:
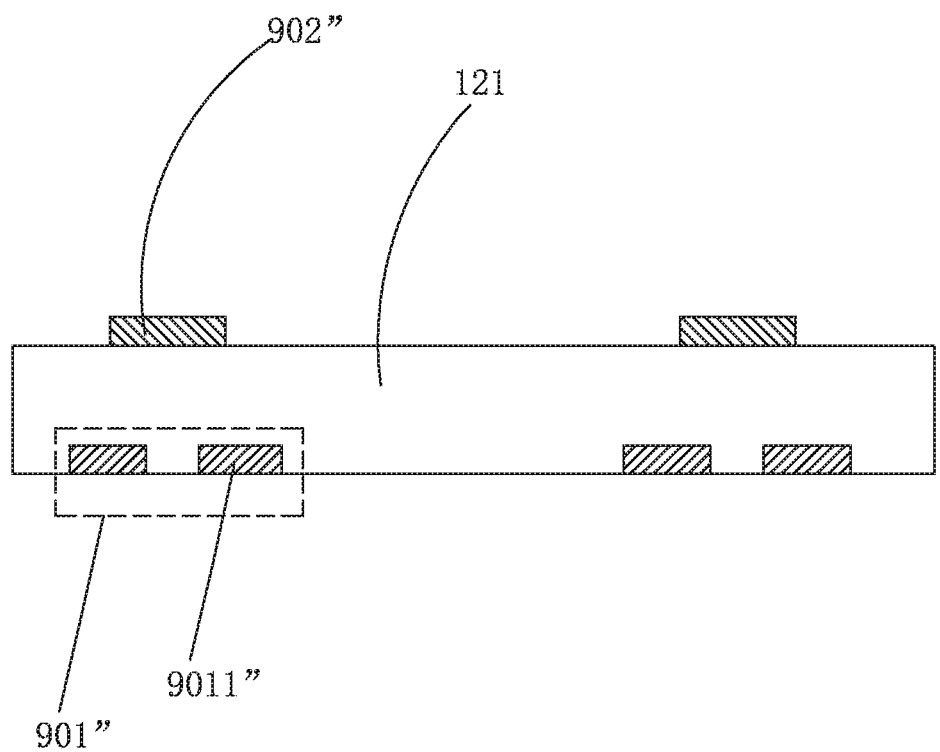
FIG. 17 is a cross-sectional diagram of two metal layers having wires surrounding a light transmissive region in the light transmissive region of the OLED display panel according to the ninth embodiment of the present invention.

Specifically, referring to FIG. 17, in the ninth embodiment of the present invention, a portion of the wires of at least two of the metal layers are curved to define the plurality of light transmissive regions 121, in any two of the metal layers having the wires surrounding the light transmissive region 121, a width of the wires 901" surrounding the light transmissive region 121 in the metal layer away from the pixel region 11 is greater than a width of the wires 902" surrounding the light transmissive region 121 in the metal layer close to the pixel region 11, and the wires surrounding the light transmissive region 121 in at least one of the metal layers include a plurality of sub-wires spaced apart. In the embodiment shown in FIG. 17, the wire 901" surrounding the light transmissive region 121 in the metal layer away from the pixel region 11 includes two sub-wires 9011", which are spaced apart. By making the wire include multiple sub-wires, the difficulty of increasing the width of the wire in the process can be reduced.

Specifically, a shape of the light transmissive region 121 is a circle, a polygon, a pattern surrounded by a plurality of arcs, or a pattern surrounded by at least one line segment and at least one arc, and is preferably a circle.

Specifically, in the OLED display panel of the present invention, the light transmissive regions 121 are disposed corresponding to the non light emitting regions 12 outside the pixel regions 11 by curving at least a portion of the wires to surround the plurality of light transmissive regions 121 for greatly improving the transmittance. Therefore, after the photosensitive members are placed in the grooves of the substrate 10 of the OLED display panel of the present invention away from the pixel regions 11, the light can penetrate the OLED display panel more into the photosensitive members, and the amount of light obtained by the photosensitive members is increased.

On the basis of the same inventive idea, the present invention further provides an OLED display device, including the foregoing organic light emitting diode display panel and photosensitive members disposed on one side of the OLED display panel. The structure of the OLED display panel will not be described repeatedly here.

Specifically, the photosensitive members are disposed in grooves on one side of the substrate 10 of the OLED display panel away from the pixel regions 11.

Specifically, in the OLED display device of the present invention, at least a portion of the wires are curved to surround the plurality of light transmissive regions 121 such that the light transmissive regions 121 are disposed corresponding to the non light emitting regions 12 outside the pixel regions 11 for greatly improving the transmittance of the OLED display device. Therefore, the light can penetrate the OLED display panel more into the photosensitive members, and the amount of light obtained by the photosensitive members is increased.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode display panel, including a plurality of pixel regions arranged in an array and non light emitting regions between the plurality of pixel regions, wherein each of the pixel regions includes an anode;
    wherein the organic light emitting diode display panel further includes a plurality of metal layers sequentially disposed under the pixel regions, each of the metal layers includes a plurality of wires, at least a portion of the wires of at least two of the metal layers are curved and arranged to form a plurality of light transmissive regions, and the light transmissive regions are disposed corresponding to the non light emitting regions; and
    wherein a width of the wires surrounding the light transmissive regions in one of the at least two of the metal layers away from the anode is greater than a width of the wires surrounding the light transmissive regions in another one of the at least two of the metal layers close to the anode.

2. The organic light emitting diode display panel according to claim 1, wherein in any two of the metal layers having the wires surrounding the light transmissive regions, the wires surrounding the light transmissive regions in at least one of the metal layers include a plurality of sub-wires spaced apart.

3. The organic light emitting diode display panel according to claim 1,
    wherein in any two of the metal layers having the wires surrounding the light transmissive regions, a distance between the wires surrounding the light transmissive regions in one of the metal layers away from the anode and a center of the light transmissive regions is less than a distance between the wires surrounding the light transmissive regions in another one of the metal layers close to the anode and the center of the light transmissive regions.

4. The organic light emitting diode display panel according to claim 3, further including a substrate, an active layer disposed on the substrate, a first metal layer disposed on the substrate and the active layer, a first insulating layer disposed on the substrate, the active layer, and the first metal layer, a second metal layer disposed on the first insulating layer, a second insulating layer disposed on the second metal layer and the first insulating layer, a third metal layer disposed on the second insulating layer, a planarization layer disposed on the third metal layer and the second insulating layer, and an anode layer disposed on the planarization layer;
    wherein the active layer is disposed corresponding to the plurality of pixel regions; the first metal layer includes a plurality of first wires; the second metal layer includes a plurality of second wires; the third metal layer includes a plurality of third wires; wherein the anode layer includes a plurality of anodes spaced apart, and each of the anodes is disposed opposite to each of the pixel regions;

wherein at least a portion of the first wires is curved, at least a portion of the second wires is curved, and at least a portion of the third wires is curved to define the plurality of light transmissive regions.

5. The organic light emitting diode display panel according to claim 1, wherein a shape of the light transmissive regions is a circle, a polygon, a pattern surrounded by a plurality of arcs, or a pattern surrounded by at least one line segment and at least one arc.

6. The organic light emitting diode display panel according to claim 1, wherein the plurality of light transmissive regions are arranged in an array;

each of the light transmissive regions is disposed among four adjacent vertices of any four adjacent pixel regions; or each of the light transmissive regions is disposed between any two adjacent pixel regions in the pixel regions of a same row; or each of the light transmissive regions is disposed between any two adjacent pixel regions in the pixel regions of a same column.

7. The organic light emitting diode display panel according to claim 4, wherein one side of the substrate away from the pixel regions is provided with grooves for placing a plurality of photosensitive members.

8. An organic light emitting diode display device, including the organic light emitting diode display panel according to claim 1 and a plurality of photosensitive members disposed on one side of the organic light emitting diode display panel.

* * * * *